United States Patent [19]

Nath et al.

[11] Patent Number: 4,574,733
[45] Date of Patent: Mar. 11, 1986

[54] SUBSTRATE SHIELD FOR PREVENTING THE DEPOSITION OF NONHOMOGENEOUS FILMS

[75] Inventors: Prem Nath, Rochester; Kevin R. Hoffman, Sterling Heights, both of Mich.

[73] Assignee: Energy Conversion Devices, Inc., Troy, Mich.

[21] Appl. No.: 418,859

[22] Filed: Sep. 16, 1982

[51] Int. Cl.$^4$ .............................................. C23C 13/10
[52] U.S. Cl. .................................... 118/718; 118/720; 118/723; 118/50.1; 427/39
[58] Field of Search .............. 118/718, 720, 723, 50.1; 427/39, 40, 41; 204/298

[56] References Cited

U.S. PATENT DOCUMENTS

| | | | |
|---|---|---|---|
| 4,013,533 | 3/1977 | Cohen-Solol | 204/298 |
| 4,317,844 | 3/1982 | Carlson | 118/723 |
| 4,369,730 | 1/1983 | Izu | 118/723 |

*Primary Examiner*—John D. Smith
*Assistant Examiner*—James J. Seidleck

*Attorney, Agent, or Firm*—Marvin S. Siskind; Lawrence G. Morris

[57] ABSTRACT

Apparatus for shielding substrates from plasma developed adjacent the ends of r.f. powered cathodes, the apparatus adapted for use in a glow discharge deposition system in which successive amorphous semiconductor layers are deposited onto a substrate. The deposition system includes at least one deposition chamber into which process gases are introduced and disassociated in the presence of electrodynamic fields created between a cathode and a substrate. The shielding apparatus of the present invention comprises a pair of relatively narrow, elongated plates adapted to be spacedly disposed in the deposition chamber so as to lie in a plane substantially parallel to the plane of the substrate. By disposing one of the plates adjacent each of the ends of the cathode, only homogeneous semiconductor films formed by uniform electrodynamic fields produced adjacent the central portion of the cathode are deposited onto the substrate. The shielding plates are preferably coated with a polyimide film to prevent discharge in the area between the shielding plates and the substrate.

7 Claims, 5 Drawing Figures

SUBSTRATE SHIELD FOR PREVENTING THE DEPOSITION OF NONHOMOGENEOUS FILMS

FIELD OF THE INVENTION

This invention relates generally to apparatus for producing improved photovoltaic devices and more particularly to substrate shields for substantially reducing the glow discharge deposition of nonhomogeneous semiconductor films onto a substrate, the nonhomogeneous nature of the films caused by nonuniform electrodynamic fields developed at the ends of the cathodes.

BACKGROUND OF THE INVENTION

This invention relates to apparatus for continuously producing photovoltaic devices on a substrate by depositing successive semiconductor layers in each of at least two adjacent glow discharge deposition chambers. The composition of each semiconductor layer is dependent upon, inter alia, the particular process gases introduced into each of the deposition chambers and the method of forming the semiconductor layer from those process gases. More particularly, the process gases introduced into the first deposition chamber are carefully controlled and isolated from the gases introduced into the adjacent deposition chamber to provide semiconductor layers of very high quality. If all semiconductor layers are not of high quality, the overall efficiency of the semiconductor device produced from those layers suffers. It is therefore necessary to carefully monitor all steps and materials which have a bearing on the quality of the semiconductor layers produced.

In the glow discharge deposition of semiconductor films onto a substrate, process gases introduced into the dedicated deposition chambers are directed to flow between a cathode and the substrate. In this area bounded by the cathode and substrate, referred to hereinafter as the plasma region, power supplied to the cathode, forms an electrodynamic field in the plasma region which operates to disassociate the process gases into species which are then deposited onto the substrate. If the electrodynamic field is not uniform over the entire length of the cathode, the properties of the semiconductor films deposited onto the substrate will be affected accordingly. More particularly, nonuniform areas in the electrodynamic field created between the cathode and substrate result in the deposition of nonhomogeneous semiconductor layers. It is therefore a principle purpose of the present invention to substantially prevent nonhomogeneous semiconductor layers formed by nonuniform electrodynamic fields from being deposited onto the substrate.

Recently, considerable efforts have been made to develop systems for depositing amorphous semiconductor alloys, each of which can encompass relatively large areas, and which can be doped to form p-type and n-type materials for the production of p-i-n-type devices which are, in operation, substantially equivalent to their crystalling counterparts.

It is now possible to prepare amorphous silicon alloys by glow discharge techniques which possess (1) acceptable concentrations of localized states in the energy gaps thereof, and (2) high quality electronic properties. Such a technique is fully described in U.S. Pat. No. 4,226,898, entitled Amorphous Semiconductors Equivalent to Crystalling Semiconductors, Stanford R. Ovshinsky and Arun Madan which issued Oct. 7, 1980; and by vapor deposition as fully described in U.S. Pat. No. 4,217,374, Stanford R. Ovshinsky and Masatsugu Izu, which issued on Aug. 12, 1980, under the same title. As disclosed in these patents, fluorine introduced into the amorphous silicon semiconductor layers operates to substantially reduce the density of the localized states therein and facilitates the addition of other alloying materials, such as germanium.

The concept of utilizing multiple cells, to enhance photovoltaic device efficiency, was discussed at least as early as 1955 by E. D. Jackson, U.S. Pat. No. 2,949,498 issued Aug. 16, 1960. The multiple cell structures therein discussed utilized p-n junction crystalling semiconductor devices. Essentially the concept is directed to utilizing different band gap devices to more efficiently collect various portions of the solar spectrum and to increase open circuit voltage (Voc.). The tandem cell device has two or more cells with the light directed serially through each cell, with a large band gap material followed by smaller band gap materials to absorb the light passed through the first cell. By substantially matching the generated currents from each cell, the overall open circuit voltages from each cell may be added, thereby making the greatest use of the light energy passing through the semiconductor device.

It is of obvious commercial importance to be able to mass produce amorphous photovoltaic devices. Unlike crystalline silicon which is limited to batch processing for the manufacture of solar cells, amorphous silicon alloys can be deposited in multiple layers over large area substrates to form solar cells in a high volume, continuous processing system. Continuous processing systems of this kind are disclosed, for example, in pending patent applications: Ser. No. 151,301, filed May 19, 1980, for A Method of Making P-Doped Silicon Films and Devices Made Therefrom; Ser. No. 244,386, filed Mar. 16, 1981, for Continuous Systems For Depositing Amorphous Semiconductor Material; Ser. No. 240,493, filed Mar. 16, 1981, for Continuous Amorphous Solar Cell Production System; Ser. No. 306,146, filed Sept. 28, 1981, for Multiple Chamber Deposition and Isolation System and Method; and Ser. No. 359,825, filed Mar. 19, 1982, for Method And Apparatus For Continuously Producing Tandem Amorphous Photovoltaic Cells. As disclosed in these applications, a substrate may be continuously advanced through a succession of deposition chambers, wherein each chamber is dedicated to the deposition of a specific material. In making a solar cell of p-i-n-type configuration, the first chamber is dedicated for depositing a p-type amorphous silicon alloy, the second chamber is dedicated for depositing an intrinsic amorphous silicon alloy, and the third chamber is dedicated for depositing an n-type amorphous silicon alloy. Since each deposited alloy, and especially the intrinsic alloy must be of high purity, the deposition environment in the intrinsic deposition chamber is isolated from the doping constituents within the other chambers to prevent the back diffusion of doping constituents into the intrinsic chamber. In the previously mentioned patent applications, wherein the systems are primarily concerned with the production of photovoltaic cells, isolation between the chambers is accomplished by gas gates through which unidirectional gas flow is established and through which an inert gas may be "swept" about the web of substrate material.

Recent improvements in continuous glow discharge deposition apparatus such as (1) establishing a substantially unidirectional flow of gases from the intrinsic deposition chamber to adjacent dopant chambers through a small gas gate passageway; (2) reducing the size of those passageways by employing magnetic assemblies which urge the unlayered substrate surface toward one of the passageway walls; and (3) using a flow of inert sweep gases across the gas gate passageway substantially improved the quality of semiconductor layers produced from the deposition apparatus. However, any aspect of manufacturing which adversely affects the quality of films produced cannot be tolerated. Accordingly, it has been discovered that the homogeneity of a semiconductor layer deposited onto the substrate at the portions of the plasma region proximate the ends of the cathodes varies from the homogeneity of the semiconductor layer deposited onto the substrate inward of those end portions of the cathodes.

By way of illustration, and referring to the drawing of FIG. 3, arrow 9 indicates the direction of movement of grounded substrate 11 which is spaced above cathode 34 to define a plasma region 80 therebetween wherein process gases are disassociated into elemental forms. In the plasma region 80, two different electrodynamic fields are present. Depending upon the nature of the electrodynamic field, the reaction kinetics for the plasma discharge will vary. Accordingly, the properties of the semiconductor layer deposited in the electrodynamic field labelled "A" are different than the properties of the semiconductor layer deposited in the electrodynamic fields labelled "B". It should therefore be readily apparent that such nonuniform electrodynamic fields in the plasma region 80 cause serious problems to deposition apparatus which utilize a continuously moving substrate.

Still referring to FIG. 3, the electrodynamic field A is substantially uniform in the direction of substrate movement 9, whereas the electrodynamic fields B are substantially nonuniform. This difference in uniformity of fields is due to the fact that field A is developed in a portion of the plasma region in which the distance between the substrate and the cathode is constant, thereby promoting field lines substantially perpendicular to the plane of the substrate. In contrast thereto, fields B are developed in portions of the plasma region adjacent the ends of the cathode 34 in which the substrate-cathode distance varies, thereby promoting angled or bent field lines relative to the plane of the substrate. The result of a substrate traveling through a plasma region characterized by nonuniform electrodynamic fields is the deposition thereonto of a nonhomogeneous semiconductor layer.

It is therefore the principle object of the present invention to substantially prevent the plasma formed in the presence of nonuniform fields formed adjacent the edges of the cathodes from being deposited onto the surface of the substrate as the substrate continuously moves therepast.

BRIEF SUMMARY OF THE INVENTION

Disclosed herein are a pair of substrate shields adapted to cooperate with a cathode to substantially prevent nonhomogeneous semiconductor films formed in the portion of the plasma region wherein the electrodynamic lines of force are not substantially perpendicular to the substrate from being deposited onto the substrate, so that the semiconductor layer deposited thereonto is homogeneous. The deposition apparatus is preferably the type which includes at least two isolated glow discharge deposition chambers operatively connected by a gas gate passageway (1) which is adapted to channel a unidirectional flow of inert sweep gases from one to the adjacent chamber of each pair of deposition chambers, and (2) through which a web of substrate material continuously travels. Each deposition chamber includes at least one elongated cathode connected to, preferably, an R.F. power source for energization of the cathode and disassociation of process gases introduced in the region between the cathode and the substrate into elemental forms for deposition onto the surface of that substrate. The cathode, being an elongated substantially planar member, has opposed distal ends. The electrodynamic field created adjacent those distal ends produces a semiconductor film different than the semiconductor film produced by the relatively large electrodynamic field created at the central portion of the cathode. The substrate shields of the present invention are elongated, substantially planar plates which extend across the transverse width of the deposition chamber so as to collect the plasma produced in the presence of those end-effected electrodynamic fields. In this manner, only the plasma produced in the uniform, central electrodynamic field may be deposited onto the substrate. The result is the deposition of a substantially homogeneous semiconductor layer. The shields are preferably coated with a polyimide film to prevent discharges in the newly defined region between the shield and the substrate.

These and other objects and advantages of the present invention will become clear from the drawings, the claims and the detailed description of the invention which follow.

DETAILED DESCRIPTION OF THE DRAWINGS

I. The Photovoltaic Cell

Figure 1:
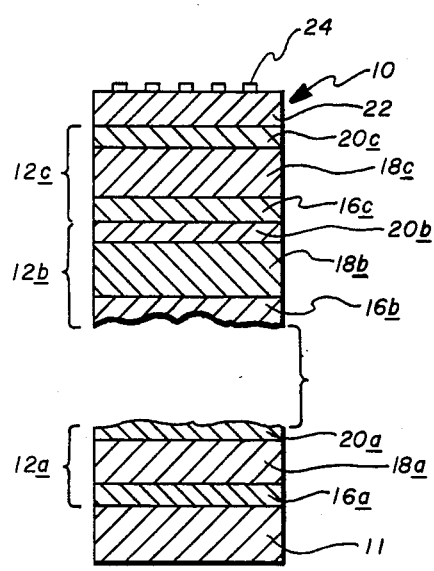
FIG. 1 is a fragmentary, cross-sectional view of a tandem photovoltaic device comprising a plurality of p-i-n type cells, each layer of the cells formed from a semiconductor alloy.
Figure 3:
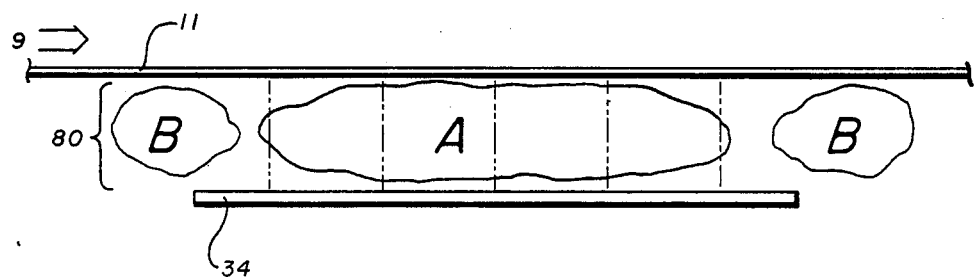
FIG. 3 is an enlarged, schematic representation of the nonuniform electrodynamic fields developed in the plasma region of a glow discharge deposition chamber not equipped with the shields of the present invention.

Referring now to the drawings and particularly to FIG. 1, a photovoltaic cell, formed of a plurality of successive p-i-n layers, each of which includes, in the preferred embodiment, an amorphous semiconductor alloy, is shown generally by the numeral 10. It is for the production of this type of photovoltaic device, wherein homogeneous amorphous alloy layers are continuously deposited onto a substrate in successive isolated deposition chambers, that the substrate shields of the present invention were developed.

More particularly, FIG. 1 shows a p-i-n-type photovoltaic device such as a solar cell made up of individual p-i-n-type cells 12a, 12b and 12c. Below the lowermost cell 12a is a substrate 11 which may be transparent or formed from a metallic material such as stainless steel, aluminum, tantalum, molybdenum or chrome. Although certain applications may require a thin oxide layer and/or a series of base contacts prior to application of the amorphous material, for purposes of this application, the term "substrate" shall include not only a flexible film, but also any elements added thereto by preliminary processing.

Each of the cells 12a, 12b and 12c are fabricated with an amorphous alloy body containing at least a silicon alloy. Each of the alloy bodies includes an n-type conductivity region or layer 20a, 20b and 20c; an intrinsic region or layer 18a, 18b and 18c; and a p-type conductivity region or layer 16a, 16b and 16c. As illustrated, cell 12b is an intermediate cell and, as indicated in FIG. 1, additional intermediate cells may be stacked atop the illustrated cells without departing from the spirit or scope of the present invention. Also, although p-i-n cells are illustrated, the substrate shields of this invention may also be used with apparatus adapted to produce single or multiple n-i-p cells.

It is to be understood that following the deposition of the semiconductor alloy layers, a further deposition process may be either performed in a separate environment or as a part of a continuous process. In this step, a TCO (transparent conductive oxide) layer 22 is added. An electrode grid 24 may be added to the device where the cell is of a sufficiently large area, or if the conductivity of the TCO layer 22 is insufficient. The grid 24 shortens the carrier path and increases the conduction efficiency.

II. The Multiple Glow Discharge Deposition Chambers

Figure 2:
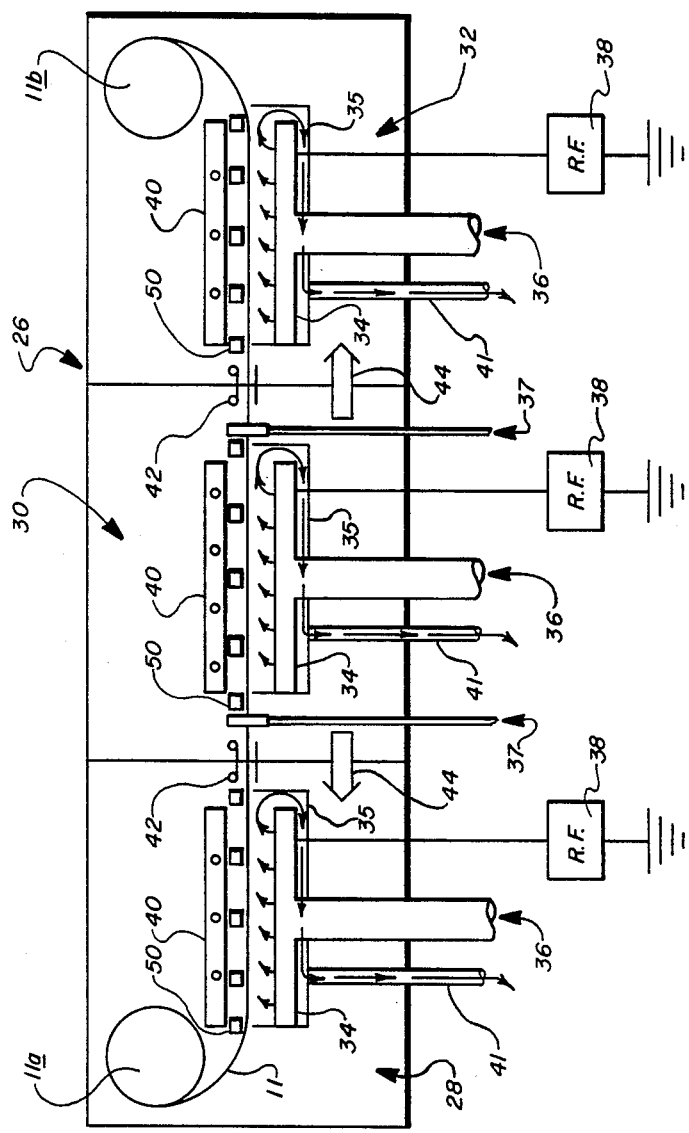
FIG. 2 is a diagrammatic representation of a multiple glow discharge chamber deposition system adapted for use in the continuous production of photovoltaic devices such as the cells shown in FIG. 1.

Turning now to FIG. 2, a diagrammatic representation of a multiple glow discharge chamber deposition apparatus for the continuous production of photovoltaic cells is generally illustrated by the reference numeral 26. The apparatus 26 includes a plurality of isolated, dedicated deposition chambers, each chamber of which is interconnected by a gas gate through which sweep gases and a web of substrate material are adapted to unidirectionally pass.

The apparatus 26 is adapted to mass produce, in the preferred embodiment, large area, amorphous photovoltaic cells having a p-i-n-type configuration on the deposition surface of a substrate material 11 which is continually fed therethrough. To deposit the amorphous alloy layers required for producing multiple p-i-n-type layer cells, the apparatus 26 includes at least one triad of deposition chambers. Each triad of deposition chamber comprises: a first deposition chamber 28 in which a p-type conductivity amorphous alloy layer is deposited onto the deposition surface of the substrate 11 as the substrate 11 passes therethrough; a second deposition chamber 30 in which an intrinsic amorphous alloy layer is deposited atop the p-type alloy layer on the deposition surface of the substrate 11 as the substrate 11 passes therethrough; and a third deposition chamber 32 in which an n-type conductivity alloy layer is deposited atop the intrinsic layer on the deposition surface of the substrate 11 as the substrate 11 passes therethrough. It should be apparent that, (1) although, only one triad of deposition chambers has been illustrated, additional triads or additional individual chambers may be added to the apparatus to provide the machine with the capability of producing photovoltaic cells having any number of amorphous p-i-n-type layers; (2) the cathode shields of the present invention are applicable to any type of glow discharge deposition apparatus, whether continuous process or batch-process prepared; (3) the substrate supply core 11a and the substrate take-up core 11b are shown in the deposition chambers for illustrative purposes only, while in reality the cores would be housed in separate chambers operatively connected to the deposition chambers; and (4) although the glow discharge illustrated herein employs cathodes with r.f. power, other glow discharge techniques such as cathodes with microwave frequencies, may be employed without departing from the spirit of the present invention.

Each deposition chamber 28, 30 and 32 of the triad is adapted to deposit a single semiconductor alloy layer, by glow discharge deposition onto the substrate 11. To that end, each of the deposition chambers 28, 30 and 32 includes: a cathode 34; a shield 35 disposed about each of the cathodes 34; a process gas supply conduit 36 for introducing process gas mixtures into the area adjacent the cathodes; an inert sweep gas conduit 37 disposed on opposed sides of the intrinsic deposition chamber; a radio frequency generator 38; an evacuation conduit 41 for removing unused process gases and nondeposited plasma; a plurality of transversely extending magnetic elements 50; a plurality of radiant heating elements shown schematically as 40; and a gas gate 42 operatively connecting the intrinsic deposition chamber to each of the dopant chambers.

The supply conduits 36 are operatively associated with the respective cathodes 34 to deliver process gas mixtures to the plasma regions created in each deposition chamber between said cathodes 34 and the substrate 11. The cathode shields 35 are adapted to operate in conjunction with the web of substrate material 11 and the evacuation conduit 41 to substantially confine the plasma within the cathode region of the deposition chambers.

The radio frequency generators 38 operate in conjunction with the cathodes 34, the radiant heaters 40 and the grounded substrate 11 to form the plasma by disassociating the elemental process gases entering the deposition chambers into deposition species. The deposition species are then deposited onto the bottom surface of the substrate 11 as amorphous semiconductor layers. The substrate 11 is maintained substantially flat by the plurality of rows of magnetic elements 50 which provide an attractive force urging the substrate upwardly, out of its normal sagging path of travel.

To form the photovoltaic cell 10 representing the preferred embodiment illustrated in FIG. 1, a p-type amorphous silicon semiconductor layer is deposited onto the substrate 11 in the deposition chamber 28, an intrinsic amorphous silicon alloy semiconductor layer is deposited atop the p-type layer in the deposition chamber 30 and an n-type amorphous silicon semiconductor alloy layer is deposited atop the intrinsic layer in the deposition chamber 32. As a result, the apparatus 26, deposits at least three amorphous silicon alloy semiconductor layers onto the substrate 11 wherein the intrinsic layer deposited in deposition chamber 30 differs in composition from the layers deposited in deposition chambers 28 and 32 by the absence of at least one element which will be referred to as the dopant or doping species.

It is important that each of the semiconductor alloy layers and particularly the intrinsic layer deposited onto a surface of the magnetic substrate 11 be of high purity in order to produce high efficiency photovoltaic devices 10. It is therefore necessary to substantially prevent nonhomogeneous deposition species produced by nonuniform electrodynamic fields adjacent the ends of the cathode from being deposited onto the substrate and forming a semiconductor film differing in homogeneity from the film produced and deposited onto the substrate adjacent the central portion of the cathode.

III. The Shielding Plates Of The Present Invention

Figure 4:
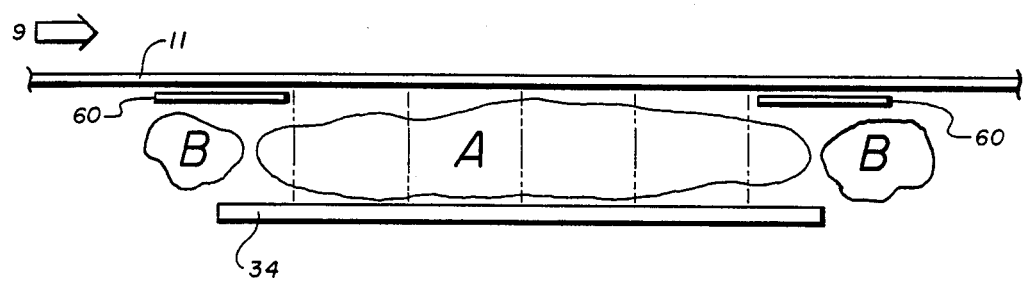
FIG. 4 is an enlarged, schematic representation illustrating the manner in which the shields of the present invention are positioned to substantially prevent nonhomogeneous plasma produced in regions of nonuniform electrodynamic fields from being deposited onto the substrate.
Figure 5:
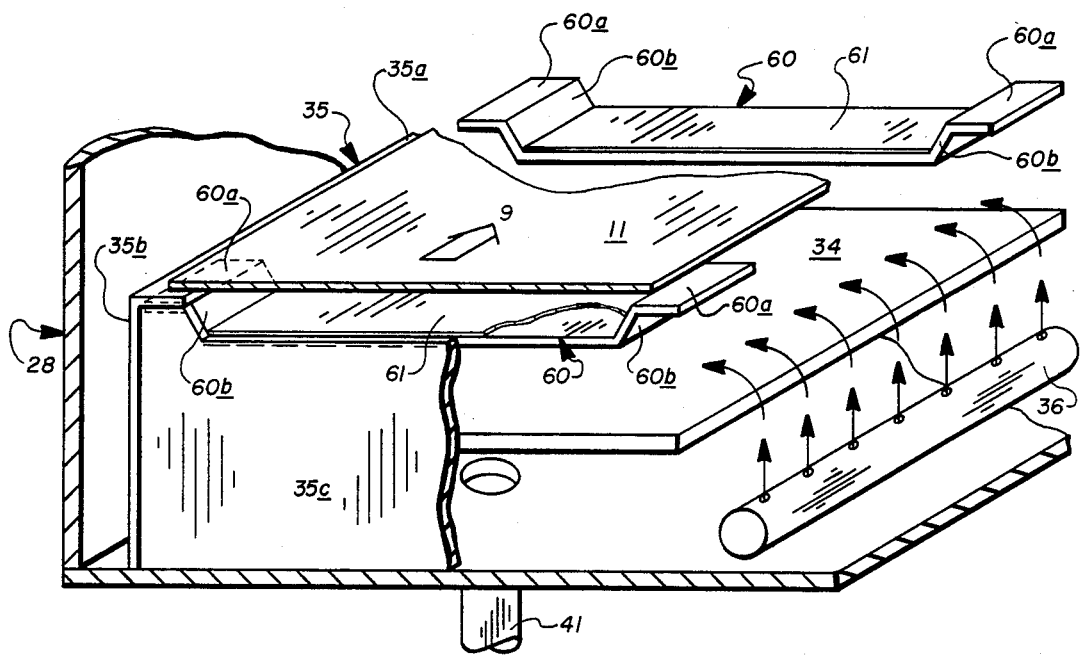
FIG. 5 is an enlarged, fragmentary perspective view illustrating the substrate shields of the present invention operatively disposed within a glow discharge deposition chamber.

FIGS. 4 and 5 illustrate the apparatus of the present invention, said apparatus adapted to prevent nonhomogeneous semiconductor films produced by nonuniform electrodynamic fields B from being deposited onto the surface of the substrate 11.

The apparatus includes a pair of substantially identical shielding plates 60, each of which is positioned adjacent one of the opposed ends of each of the at least one cathode 34 in each deposition chamber. It should be apparent that, although only a single cathode is shown in the schematic drawing of the deposition chambers of FIG. 2, a plurality of cathodes may actually be used in a single deposition chamber. In such instances, a shielding plate 60 is to be positioned adjacent each end of each cathode.

The shielding plates 60 are thin, elongated metallic, nonmagnetic members, preferably 304 stainless steel. In the preferred embodiment, each plate 60 is approximately two (2) inches wide and approximately fourteen (14) inches long. The length of the shielding plate 60 is selected so as to substantially cover the transverse width of the substrate 11 which passes thereover. The width of the shielding plate 60 is selected so that the plate will both (1) overlap the edge of the cathode 34 and (2) blanket the portion of the substrate 11 extending immediately adjacent and longitudinally removed from the edge of the cathode (preferably referred to as the region of nonuniform electrodynamic fields B). The length of the shielding plates 60 is readily modifiable to accommodate substrates of various widths. Likewise, the width of the shielding plates 60 is readily modifiable if it were determined that the nonuniform electrodynamic fields B extended beyond and were causing nonhomogeneous films to be deposited outside of the region blanketed by the current two inch width of the plates.

FIG. 4 illustrates the manner in which the shielding plates 60 blanket the substrate 11 in the areas of nonuniform electrodynamic fields B so that plasma developed by fields B is deposited onto the shielding plates 60 rather than onto the substrate 11 which travels therepast in the direction of arrow 9. In order to best accomplish that function, the shielding plates 60 are positioned in a plane generally parallel to the plane of travel of the substrate 11 but removed downwardly therefrom by a distance of approximately one-quarter ($\frac{1}{4}$) inch.

Finally, a polyimide film 61 is placed onto at least the surface of the shielding plates 60 facing the substrate. The polyimide film both prevents discharge in the area between the substrate and the plates and prevents deposition onto the upper surface of the shielding plates. The polyimide film may be KAPTON (registered trademark of Dupont Corporation), type 4. Polyimide films were selected because of their inherent properties of high temperature stability, good wear resistance at high temperature and low outgassing in high vacuum. While other films may be used, they should exhibit similar properties.

FIG. 5 depicts the operative deployment of the shielding plates 60 in a deposition chamber such as a dopant chamber 28. As depicted therein, the deposition chamber 28 includes a left hand plasma confining shield 35 which includes a top flange 35a, side wall 35b, and a front wall 35c. The bottom surface of the substrate 11 contacts the upper surface of flange 35a to substantially prevent process gases and plasma from leaking therepast. A similar plasma confining shield (although not shown) is positioned on the right hand side of the deposition chamber so that the right and left hand shields in combination with the lower wall of the chamber and the bottom surface of the substrate substantially confine the plasma to the cathode region of the deposition chamber. The substrate shielding plates 60 are formed with angled spacing flanges 60b and mounting flanges 60a. The mounting flanges 60a are employed to connect the shielding plates 60 to the top flanges 35a of the plasma confinement shields 35. The spacing flanges 60b serve to space the shielding plates 60 from the layered surface of the substrate 11 the preferred one-quarter inch distance.

In this manner, the substrate shielding plates 60 substantially prevent diassociated species formed by nonuniform electrodynamic fields B from reaching and being deposited onto the substrate 11. The result is the deposition onto the web of substrate material 11 of homogeneous semiconductor layers produced by uniform electrodynamic fields A formed in the central cathode region. This, of course, assumes the absence of material nonuniformities in the direction of substrate movement 9.

It should be understood that the present invention is not limited to the precise structure of the illustrated embodiments. It is intended that the foregoing description of the presently preferred embodiments be regarded as an illustration rather than as a limitation of the present invention. It is the claims which follow, including all equivalents, which are intended to define the scope of this invention.

What we claim for letters patent is:

1. In glow discharge deposition apparatus wherein semiconductor layers are deposited onto a substrate, the deposition apparatus comprising at least one dedicated deposition chamber which includes: substrate support means; at least one cathode spaced from the substrate support means; means for introducing process gases between the substrate support means and the cathode; and means for energizing the at least one cathode to develop an electrodynamic field in which the process gases are disassociated into a plasma, the field comprising a central substantially uniform region separating a pair of nonuniform regions; the improvement comprising, in combination:

shielding means adapted to substantially prevent nonhomogeneous semiconductor films formed by the nonuniform electrodynamic fields from being deposited onto the substrate, whereby only the substantially homogeneous semiconductor film formed by the central uniform electrodynamic field is deposited onto the substrate.

2. Apparatus as in claim 1, wherein the shielding means comprise a pair of shielding plates operatively associated with each of the at least one cathode.

3. Apparatus as in claim 2, wherein each one of the pair of shielding plates are operatively secured adjacent the substrate support means in the region of nonuniform electrodynamic fields, whereby the nonhomogeneous semiconductor films are adapted to be deposited onto the surface of the shielding plates rather than onto the substrate.

4. Apparatus as in claim 3, wherein the shielding plates are covered with a polymer coating to prevent glow discharge between the shielding plates and the substrate.

5. Apparatus as in claim 4, wherein the shielding plates are covered with a polyimide coating.

6. Apparatus as in claim 3, wherein the apparatus further includes an elongated substrate, and means are provided for continuously advancing said substrate through the deposition chamber in a plane generally parallel to the plane of the at least one cathode, and wherein the nonuniform electordynamic fields are developed adjacent the leading and trailing ends of each of the at least one cathode.

7. Apparatus as in claim 6, wherein the shielding plates are approximately 16 inches long, 2 inches wide and are operatively secured to the deposition apparatus so as to substantially blanket the portions of the substrate overlying the leading and trailing ends of the cathode.

* * * * *